United States Patent
Lu et al.

(10) Patent No.: US 7,303,841 B2
(45) Date of Patent: *Dec. 4, 2007

(54) REPAIR OF PHOTOLITHOGRAPHY MASKS BY SUB-WAVELENGTH ARTIFICIAL GRATING TECHNOLOGY

(75) Inventors: Ming Lu, Sijhih (TW); King-chang Shu, Hsin-Chu (TW); Bin-chang Chang, Hsin-Chu (TW); Li-wei Kung, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 463 days.

This patent is subject to a terminal disclaimer.

(21) Appl. No.: 10/810,385

(22) Filed: Mar. 26, 2004

(65) Prior Publication Data

US 2005/0214653 A1    Sep. 29, 2005

(51) Int. Cl.
*G03F 1/00* (2006.01)
*G03F 1/14* (2006.01)
*G06K 9/00* (2006.01)

(52) U.S. Cl. .................................. 430/5; 382/144
(58) Field of Classification Search ................ 430/5
See application file for complete search history.

(56) References Cited

U.S. PATENT DOCUMENTS

| | | | |
|---|---|---|---|
| 4,340,654 A | 7/1982 | Campi | |
| 4,609,556 A | 9/1986 | Goedert | |
| 4,778,693 A | 10/1988 | Drozdowicz et al. | |
| 4,906,326 A | 3/1990 | Amemiya et al. | |
| 4,968,390 A | 11/1990 | Bard et al. | |
| 5,018,212 A | 5/1991 | Manns et al. | |
| 5,035,787 A | 7/1991 | Parker et al. | |
| 5,194,344 A | 3/1993 | Cathey, Jr. et al. | |
| 5,194,345 A | 3/1993 | Rolfson | |
| 5,208,125 A | 5/1993 | Lowrey et al. | |
| 5,282,140 A * | 1/1994 | Tazawa et al. ............. 700/98 |
| 5,348,826 A | 9/1994 | Dao et al. | |
| 5,384,219 A | 1/1995 | Dao et al. | |
| 5,405,721 A | 4/1995 | Pierrat | |
| 5,429,730 A | 7/1995 | Nakamura et al. | |
| 5,440,426 A | 8/1995 | Sandstrom | |
| 5,460,908 A | 10/1995 | Reinberg | |
| 5,569,392 A | 10/1996 | Miyoshi et al. | |
| 5,582,939 A | 12/1996 | Pierrat | |
| 5,615,954 A | 4/1997 | Nishizawa et al. | |

(Continued)

OTHER PUBLICATIONS

Phillippe Lalanne and Mike Hutley, The Optical Properties of Artificial Media Structued at a Subwavelength Scale, (Sep. 9, 2003), Encyclopedia of Optical Engineering, R. Driggers, Ed., Marcel Dekker, New York (2003), pp. 1-11 [Document CH in the Mar. 26, 2004 IDS].*

(Continued)

*Primary Examiner*—Mark F. Huff
*Assistant Examiner*—John Ruggles
(74) *Attorney, Agent, or Firm*—Duane Morris LLP

(57) ABSTRACT

A method is disclosed for repairing mask damage defects. After determining topographical information of a defect on a mask, one or more grating repair specifications are determined based on an optical simulation using the topographical information. One or more artificial grating areas are formed on one or more sides of the defect based on the grating repair specification.

23 Claims, 7 Drawing Sheets

U.S. PATENT DOCUMENTS

| | | | |
|---|---|---|---|
| 5,618,760 | A | 4/1997 | Soh et al. |
| 5,623,365 | A | 4/1997 | Kuba |
| 5,667,919 | A | 9/1997 | Tu et al. |
| 5,786,114 | A | 7/1998 | Hashimoto |
| 5,795,685 | A | 8/1998 | Liebmann et al. |
| 5,798,193 | A | 8/1998 | Pierrat et al. |
| 5,853,923 | A | 12/1998 | Tzu |
| 5,881,125 | A | 3/1999 | Dao |
| 5,948,468 | A | 9/1999 | Sweatt et al. |
| 5,955,222 | A | 9/1999 | Hibbs et al. |
| 5,959,325 | A | 9/1999 | Adair et al. |
| 5,965,303 | A | 10/1999 | Huang |
| 6,030,731 | A | 2/2000 | Yang |
| 6,037,087 | A | 3/2000 | Pierrat et al. |
| 6,042,738 | A | 3/2000 | Casey, Jr. et al. |
| 6,096,459 | A | 8/2000 | Yang |
| 6,103,430 | A | 8/2000 | Yang |
| 6,106,980 | A | 8/2000 | Pierrat et al. |
| 6,114,073 | A | 9/2000 | Yang |
| 6,197,455 | B1 | 3/2001 | Yedur et al. |
| 6,262,791 | B1 | 7/2001 | Powell |
| 6,277,526 | B1 | 8/2001 | Yang |
| 6,291,115 | B1 | 9/2001 | Yang |
| 6,292,297 | B1 | 9/2001 | Danziger et al. |
| 6,304,316 | B1 | 10/2001 | Jain et al. |
| 6,322,935 | B1 | 11/2001 | Smith |
| 6,335,129 | B1 | 1/2002 | Asano et al. |
| 6,346,352 | B1 | 2/2002 | Hayden et al. |
| 6,361,904 | B1 | 3/2002 | Chiu |
| 6,366,404 | B1 | 4/2002 | Hiraiwa et al. |
| 6,369,948 | B2 | 4/2002 | Danziger et al. |
| 6,373,976 | B1 | 4/2002 | Pierrat et al. |
| 6,391,217 | B2 | 5/2002 | Schaffer et al. |
| 6,440,615 | B1 | 8/2002 | Shimizu |
| 6,447,962 | B2 | 9/2002 | Yang |
| 6,462,874 | B1 | 10/2002 | Soskind |
| 6,480,263 | B1 | 11/2002 | Smith |
| 6,506,525 | B2 | 1/2003 | Choi et al. |
| 6,524,756 | B1 | 2/2003 | Wu |
| 6,534,221 | B2 | 3/2003 | Lee et al. |
| 6,982,134 | B2 * | 1/2006 | Lin .............................. 430/5 |
| 2002/0058188 | A1 * | 5/2002 | Iwasaki et al. ................. 430/5 |
| 2003/0207184 | A1 * | 11/2003 | Smith ........................... 430/5 |
| 2004/0191642 | A1 * | 9/2004 | Lin .............................. 430/5 |
| 2004/0234869 | A1 * | 11/2004 | Tejnil ........................... 430/5 |

OTHER PUBLICATIONS

Lalanne, Philippe et al, "The optical properties of artificial media structured at a subwavelength scale", Floating Images Ltd., Hampton, TW12 3JU, United Kingdom, Sep. 2003.

Ohlidal, I. et al., "Matrix Formalism For Imperfect Thin Films", Acta Physica Slovaca, vol. 50, No. 4, pp. 489-500, Aug. 2000.

Richter, Ivan et al., "Design considerations of form birefringent microstructures", Applied Optics, vol. 34, No. 14, pp. 2421-2429, May 10, 1995.

* cited by examiner

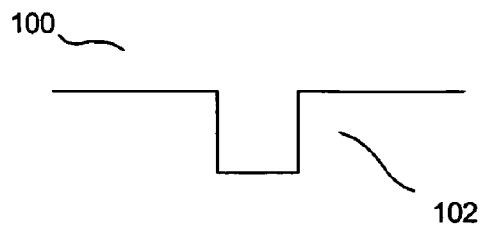
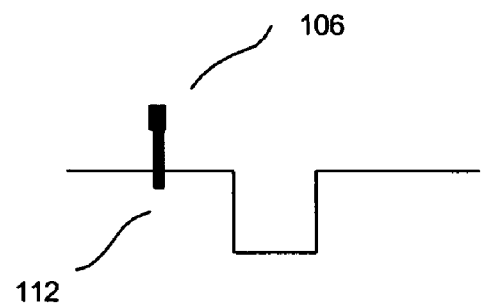
FIG. 4A     FIG. 4B
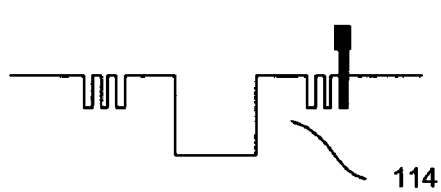
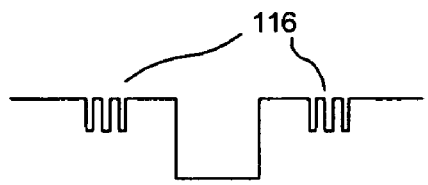
FIG. 4C     FIG. 4D

DIFFRACTION GRATING PHASE ANGLE IN RADIANS

| Fill Factor | Grating depth in nm | | | | | | |
|---|---|---|---|---|---|---|---|
| | 0 | 16 | 24 | 32 | 40 | 48 | 56 |
| 0.00 | 0.000000 | 0.292184 | 0.438724 | 0.586012 | 0.732756 | 0.879464 | 1.026484 |
| 0.50 | 0.000000 | 0.167539 | 0.246400 | 0.320406 | 0.392915 | 0.469414 | 0.539259 |
| 0.67 | 0.000000 | 0.112897 | 0.165815 | 0.216295 | 0.264343 | 0.312888 | 0.369056 |
| 0.75 | 0.000000 | 0.088724 | 0.127875 | 0.161847 | 0.196206 | 0.236562 | 0.281579 |
| 0.80 | 0.000000 | 0.069041 | 0.098334 | 0.125714 | 0.153415 | 0.181938 | 0.217406 |

FIG. 7

REPAIR OF PHOTOLITHOGRAPHY MASKS BY SUB-WAVELENGTH ARTIFICIAL GRATING TECHNOLOGY

BACKGROUND

The present invention relates generally to photolithography masks, and more particularly to methods to fabricate photolithography masks. Still more particularly, the present invention relates to methods to repair defects in material substrates used to fabricate these masks.

Lithography is a process by which the pattern of a lithography mask is transferred to a layer of resist deposited on the surface of the semiconductor wafer. Photolithography is a variation of lithography techniques whereby ultra-violet (UV) radiation is utilized to expose a resist layer.

The lithography mask used in photolithography is generally known as a photomask, which is used to expose resist in selected areas. Typically, the photolithography mask consists of chrome areas supported by a high-quality quartz plate. The former is opaque to UV radiation, while the latter is transparent to UV radiation. By selectively exposing areas of oxide deposits on a wafer, and after a number of subsquent steps including but not limiting to etching and doping, semiconductor integrated circuit (ICs) devices may be developed.

As IC devices become more complex and compact, precision in photolithography is increasingly required. One demand is to reduce the minimum-feature size of these devices, which in turn requires a proportional reduction in mask minimum-feature size. However, as the mask minimum-feature size becomes smaller, defect size also becomes smaller. Unfortunately, even a small, undetected defect may cause fatal defects in the final photolithographic image printed on the wafer-substrate. Since the occurrence rate of most defects is roughly inversely proportional to defect size, as mask minimum-feature size becomes smaller, the number of fatal defects increases in mask production.

In photomasks produced for the "phase-shift photolithography" technology, defects may cause even more problems because of the required additional processing associated with etching of steps into the quartz substrates. Therefore, in addition to surface pits originating from voids in the original quartz substrate material, surface pit defects can be easily produced during the quartz-etching steps of phase-shift mask fabrication.

In most cases photomasks are required to be perfect. It is well known in the industry that as a result of defects, yields of masks for advanced devices can be so low that the concern goes beyond price. Indeed, many, if not most advanced photomasks require reworking to repair defects before they are deemed acceptable.

Several pit defect repair techniques have been developed, and some of them are illustrated in FIGS. 1-3. In FIG. 1, a photomask 100 has a quartz pit defect 102 that is filled with deposited material 104, which has a refraction index that is close to the refraction index of quartz. A probe 106 is used to remove excess material. FIG. 2 shows another technique in which the original pit 102 is deepened to a two-pi depth 108. FIG. 3 illustrates still another technique, cutting one or more steps 110 to surround the pit.

However, all these techniques are slow and expensive, primarily due to the time required for removing a certain amount of substrate material. What is needed is an improved method for repairing mask quartz defects.

SUMMARY

In view of the foregoing, this disclosure provides a method for defect repair in the material substrates that are used to fabricate photolithography masks that are in turn used for making semiconductor IC devices. After determining topographical information of a defect on a mask, one or more grating repair specifications are determined based on an optical simulation using the topographical information. In one example, one or more artificial grating areas are formed on one or more sides of the defect based on the grating repair specification, wherein the artificial grating areas are no wider than a predetermined wavelength used for photolithography in which the mask is used, and wherein the artificial grating areas change the effective refractive index of a localized area encompassing the defect so that the defect does not cause undesired image printing when the mask is exposed to a light source of the predetermined wavelength.

Various aspects and advantages will become apparent from the following detailed description, taken in conjunction with the accompanying drawings, illustrating the principles of the disclosure by way of examples.

BRIEF DESCRIPTION OF THE DRAWINGS

FIGS. 4A-D illustrate an improved method for repairing a pit defect in a quartz photomask in accordance with one example of the present disclosure.

FIG. 7 is a tabulation of diffraction grating depth against fill fact in accordance with one example of the present disclosure.

DESCRIPTION

Figure 1:
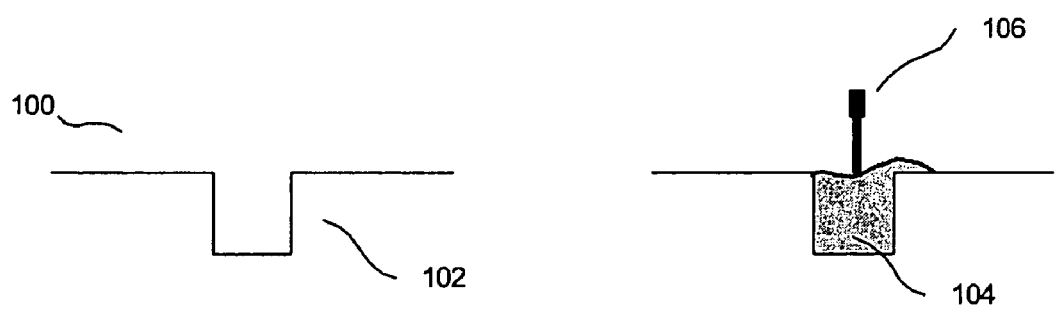
FIGS. 1 to 3 illustrate conventional photomask damage repair methods.
Figure 2:
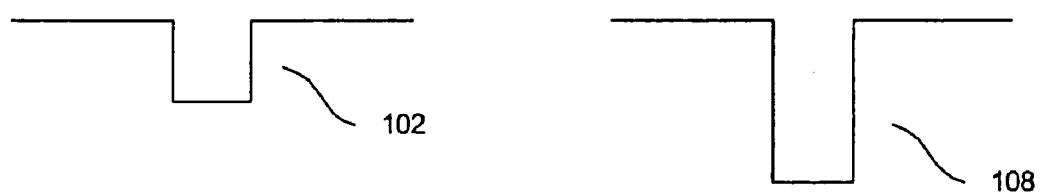
Figure 3:

The present disclosure provides an improved method for repair mask defects by modifying reflection and refraction from optical surfaces by adding grating areas around a defect. The presence of an artificial diffraction grating with dimensions below the photolithographic exposure wavelength (a so-called sub-wavelength grating) produces the effect of reducing the refraction index in the immediate area of the grating. By forming (e.g., cutting into the substrate) a suitable grating area near a localized defect, the localized defect is not going to generate any "ghost image" during a photolithographic exposure step so that the damaged photomask is effectively repaired. In the following description, a quartz mask is used as an example for illustration purposes, and it is understood that other mask substrate materials can also be used such as $CaF_2$. Further, in the examples shown below, only one particular type of defects, i.e., mask pits, is used, but it is also understood that the same repair concept may be applicable to other types of mask defects as long as the grating areas causes the change of the effective refraction index of the localized area in which the defect is located after the repair work is done.

FIGS. 4A-4D illustrate how one localized defect (e.g., a pit) of a damaged photomask is repaired in accordance with one example of the present disclosure. In FIG. 4A, it is assumed that the photomask 100 has been almost completed through the industry standard photomask fabrication process. FIG. 4A shows an area of the photomask 100 that has a pit defect 102 on the surface of the quartz substrate. This pit defect could have been a void in the original quartz material, or it could have been accidentally produced during fabrication of the photomask. Pit defects are especially likely for photomasks used in phase-shift lithography, whose processing includes the etching of steps into the surface of the quartz substrate.

FIG. 4B shows the formation of the first groove 112 of the grating using a probe-tip 106. FIG. 4C shows the cutting of the last groove 114 of the grating. FIG. 4D shows the finished diffraction-grating 116 and adjacent pit defect. For simplicity, the grating is shown to have only three grooves, but it is understood by those skilled in the art that the actual number would typically be larger.

Since the tip-wear is mainly a function of the volume of the quartz removed, cost savings may be attained given that the fabrication of the surrounding diffraction-grating is relatively easy. The diffraction-grating should also be deliberately designed so as to minimize the volume of quartz removed. Compared to other repair methods, since the volume of quartz removed is much less, time and tip-wear may be saved.

For illustration purposes, it is assumed that a photomask 100 has a simple, rectangular-shaped pit whose width is 2400 nm and whose depth is 80 nm. However, it is understood by those skilled in the art that when these dimensions apply to the actual photomask, they are typically multiple times (e.g., 4×) larger than the final on-wafer dimensions. The assumed photolithography wavelength is 193 nm. In practice, the detailed pit information and its repair information (or pit-morphology) can be determined by several methods such as using simulation tools and/or an atomic force microscopy tool (AFM).

Figure 5A:
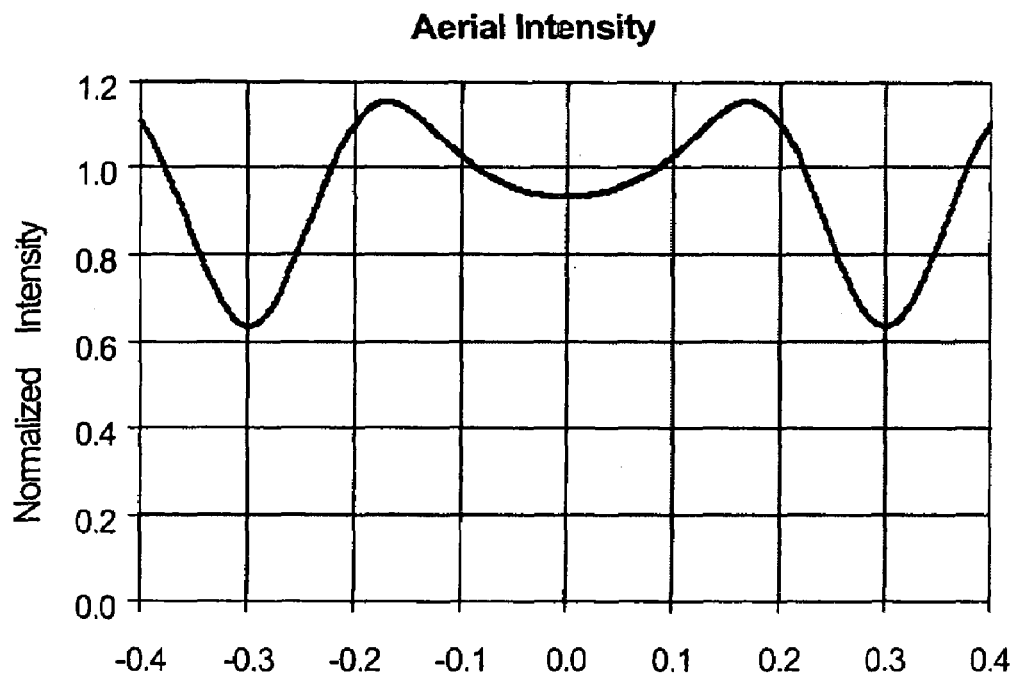
FIGS. 5A and 5B illustrate the aerial intensity and the phase change, respectively, of a defect using conventional simulation tools.
Figure 5B:
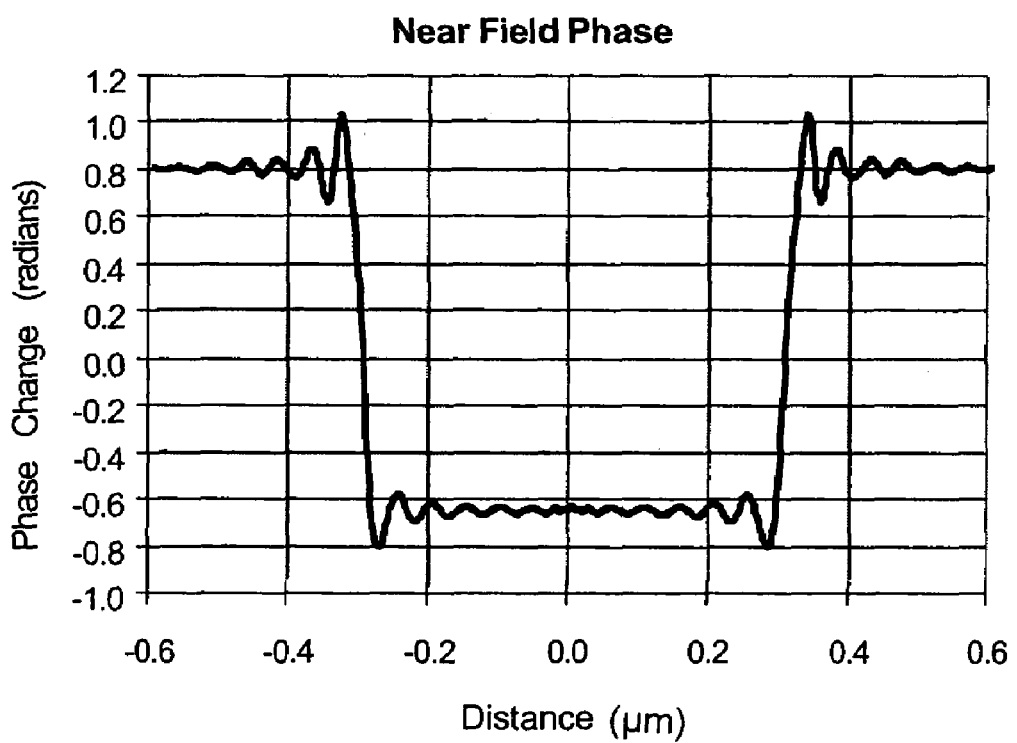

Using conventional simulation tools known in the industry, the computed aerial intensity and near field phase information for the image of the pit defect are given in FIGS. 5A and 5B. It is notable that light intensity reduces significantly at two sides of the pit. That reduced energy might inadequately expose the final wafer resist at these points. The phase difference as shown clearly indicates that this defect could lead to imaging defects such as the "ghost image" problem at certain locations.

The present disclosure provides a method to place diffraction-gratings to add enough light having the proper phase-angle at these locations such that light intensity will be sufficient to properly expose the resist or avoid the huge phase difference. Practically, as a rule of thumb, simulation may begin with a phase change that, when subtracted from the defect phase-angle, gives a resultant phase-angle less than 60 degrees (approximately 1 radian).

The phase angle of the defect is the phase-difference $\Delta\Theta$ associated with the difference in path-length between two adjacent ray paths, one just inside the pit and the other just outside the pit, is given as follows:

$$\Delta\Theta \approx \frac{2\pi D}{\lambda}(n_q - n_o)$$

where
 D=pit depth
 $n_q$=refractive index of quartz (1.5621)
 $n_o$=refraction index of air (1.0)
 $\lambda$=photolithographic light source wavelength (193 nm)

According to the previous example, $\Delta\Theta = [2\pi/193] \times 80$ nm$\times(1.5621-1)=1.464$ radian=84 degrees.

Based on the previous discussion, it is desirable to bring the resultant phase angle under 60 degrees, therefore, a phase change of approximately 24 degrees (0.42 radians) is sufficient. To summarize, the light from the diffraction grating, when superimposed with light from the defect, should result in light from the combined grating and defect that is close enough (within 60 degrees) to be in phase with the main beam of exposing light so that the dips in the aerial image of FIG. 5 will not be as prominent. As such, the phase change $\Delta\Phi$ needed is determined.

The phase change $\Delta\Phi$ can also be mathematically represented as below:

$$\Delta\Phi \approx \frac{2\pi d}{\lambda}(n_s - n_{eff})$$

where
 d=groove depth
 $n_s$=refractive index of the substrate
 $n_{eff}$=effective refractive index of the grating
 $\lambda$=photolithographic light source wavelength (193 nm)

Figure 6:
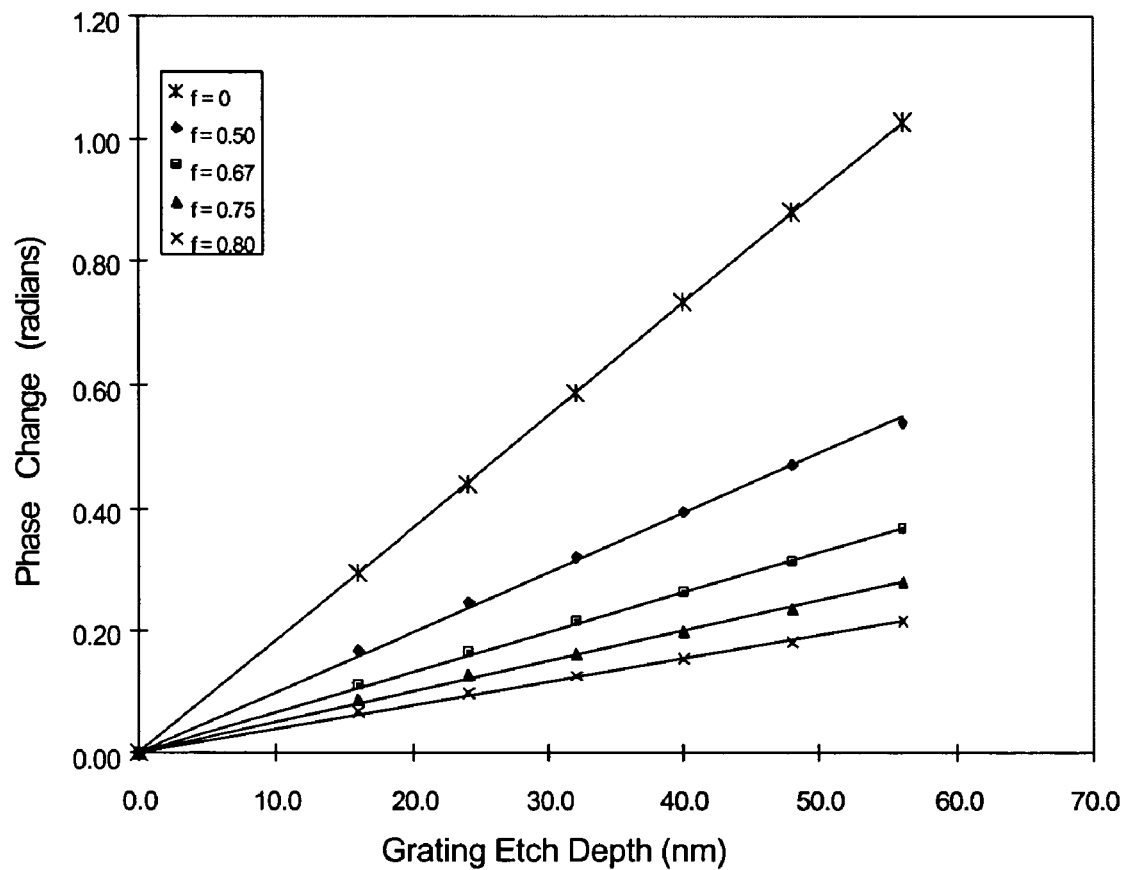
FIG. 6 illustrates the relationship between a phase change and groove depth for various fill-factors in accordance with one example of the present disclosure.

FIG. 6 graphically illustrates the relation between the phase change, $\Delta\Phi$, the grating groove depth, d, and the fill-factor, f. The fill factor is the fraction of the photomask surface inside the diffraction-grating that remains undisturbed ("filled" with quartz) after the grooves are cut, which is given by:

$$f=1-(s/\Lambda)$$

where
 s=the "grating space" (groove width)
 $\Lambda$=the grating pitch (center-to-center or side-to-side groove spacing)

FIG. 7 is a tabulation of values showing the relation between the fill factor, the grating depth, and the phase change.

It can be seen from FIG. 6 that multiple repair solutions can be found for any particular phase change value in terms of the geometric specifications of the grating area. For example, when the phase change is at 0.2, since there are five different lines associated with five different fill factors, there are five repair solutions. For selecting the best combination of the groove depth, the grating space, the grating pitch, some comparative calculations and/or simulations may be done to see which one gives the best for the repair result. For example, if the grating space is kept at 16 nm, once the fill factor is picked, the grating pitch is determined. As a result, the grating repair specifications for the pit in the mask quartz are all determined. Referring to FIG. 6, it is notable that the groove depth is associated with fill factor, and to the extent possible, the less groove depth is selected, the more advantageous it is since the volume of quartz removed can be minimized.

Figure 8A:
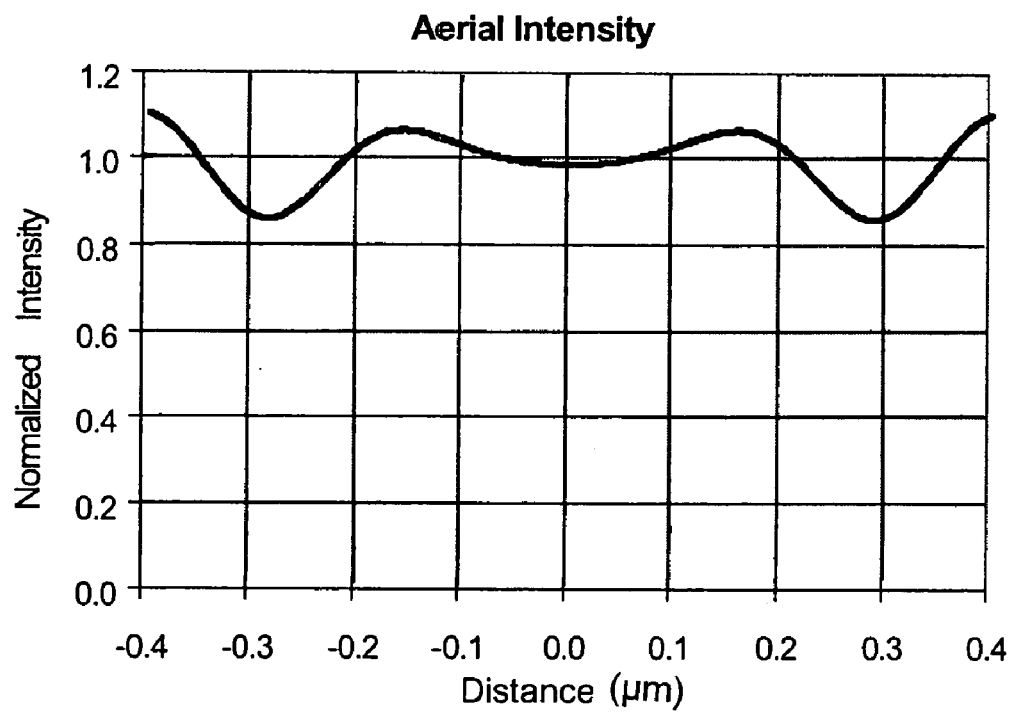
FIGS. 8A and 8B illustrate the aerial intensity and the phase change, respectively, of a defect with an exemplary grating area in accordance with one example of the present disclosure.
Figure 8B:
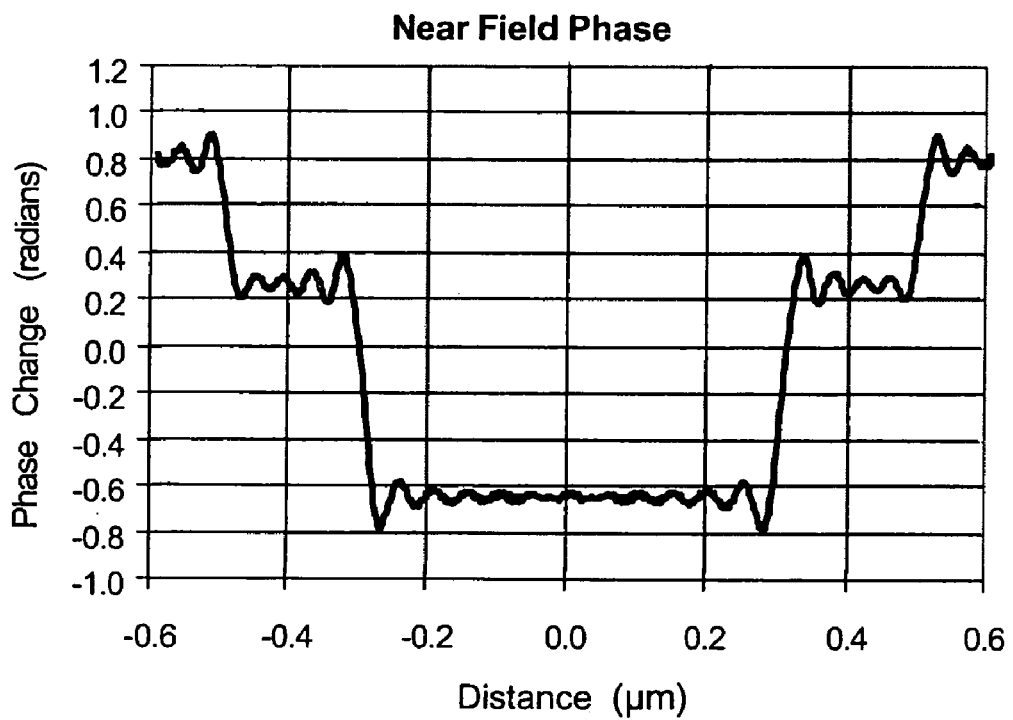

FIGS. 8A and 8B illustrate the simulated aerial intensity and near field phase information, respectively, for the combined pit and the adjacent diffraction-gratings. In this case the intensity of the exposure light is reasonably constant, i.e the defect would not print. In this example, it can be seen that a groove depth of 16 nm will give a proper phase-shift so that the pit is not going to cause the ghost image. The number of grooves in the grating would be chosen so that the width of the whole grating area is sufficient to result in a satisfactory final phase shift as indicated by the step width at roughly the 0.2 radians line level. As such, from the simulation, the width of grating area can be estimated.

In practice, a more common example would be a small pit defect that might be surrounded on all four sides by gratings in order to repair it. The final repaired damage area is a part of a localized area in which the grating areas surround the damage area. Optical simulation from the final topology would be necessary before the repair is deemed to be complete. When the wavelength of the lithography process is under 193 nm, the mask repair work as described above become very important for the production of semiconductor manufacture processes.

Figure 9:
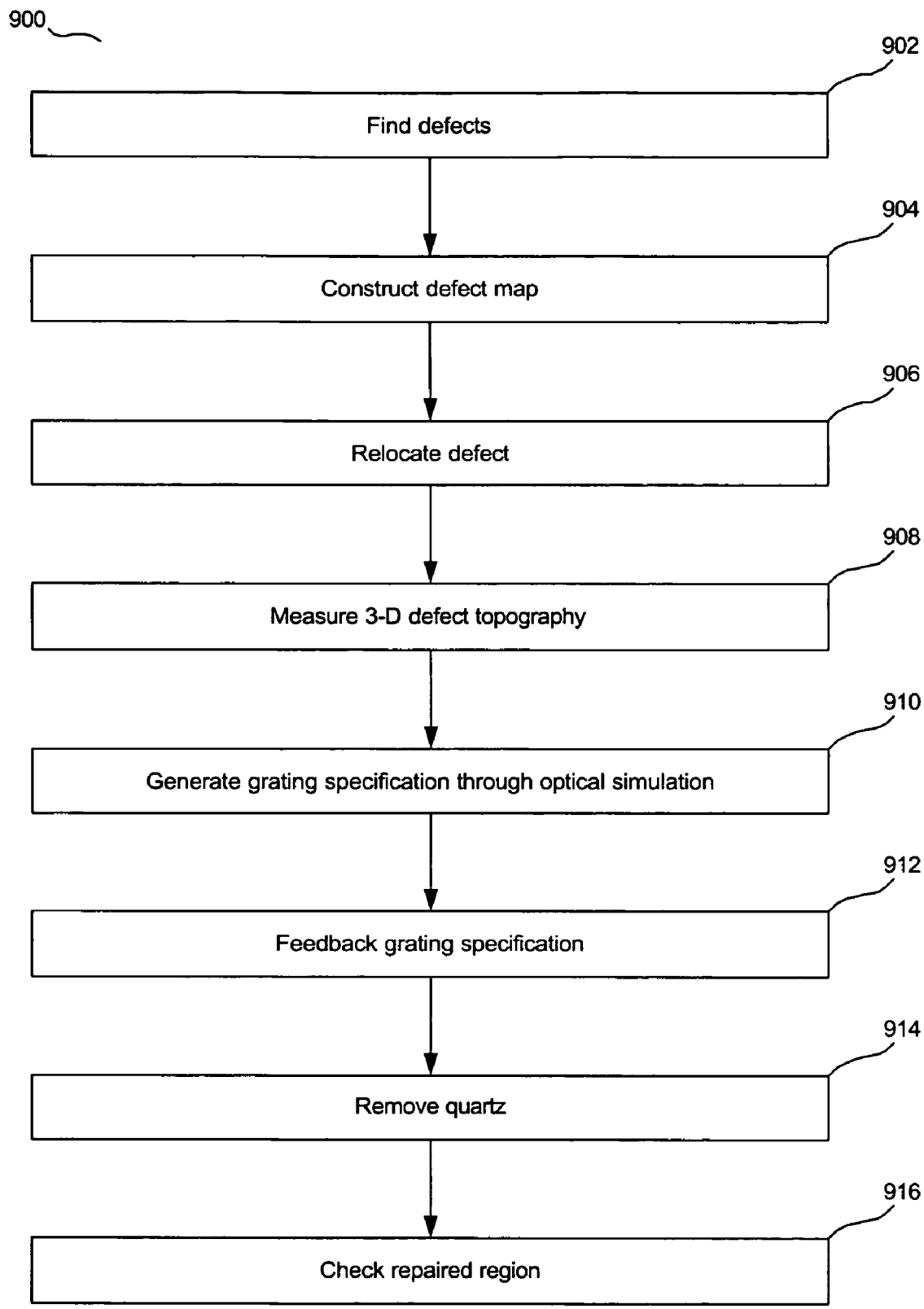
FIG. 9 is a flow chart illustrating the repair steps in accordance with one example of the present disclosure.

FIG. 9 illustrates a flow chart 900 for the disclosed repair method. In step 902, a photomask which has completed the main steps of the photomask fabrication process is used. In this inspection step, the photomask is checked for defects. It is notable that indeed many, if not most advanced photomasks require reworking to repair defects before they are deemed acceptable. In step 904, a detailed map is constructed for each defect's precise location. The map is then transferred to the a repair system where the repair of fatal defects will take place. It is understood that the repair system may be integrated with the AFM platform.

After moving the photomask to the repair system, in step 906 a particular defect (e.g. the surface quartz-pit in one example) must first be re-located by the AFM. Next, in step 908, detailed pit morphology is determined by using the AFM. This pit morphology information is next fed into the optical simulation computer system in step 910. Based on the pit morphology information, the grating specifications are identified. In step 912 the photomask specification is fed back to the repair system for making the grating. In step 914, the sub-wavelength artificial diffraction grating is actually cut into the surface of the quartz photomask by using the repair system in material-removal mode. Finally, in step 916, the AFM is used in mapping mode to determine the morphology or the modified topographical information of the actual resultant pit and adjacent grating. In step 916, the detailed morphological information can be analyzed in the optical simulation system to confirm that the results are as intended and the defect in effect repaired, i.e. that the image of the defect will not print during the photolithographic process.

In practice, computational steps 910 and 916 are optional, and may be omitted based on experience with previous successful results. Alternatively, this diffraction-grating could be formed by using any other nanofabrication technique known to those skilled in the art.

The above disclosure provides different embodiments, or examples, for implementing different features of the invention. Specific examples of components and processes are described to help clarify the invention. These are, of course, merely examples and are not intended to limit the invention from that described in the claims.

While the invention has been particularly shown and described with reference to the preferred embodiment thereof, it will be understood by those skilled in the art that various changes in form and detail may be made therein without departing from the spirit and scope of the invention, as set forth in the following claims.

What is claimed is:

1. A method for repairing mask damage defects, the method comprising:
    determining topographical information of a defect on a mask;
    determining one or more grating repair specifications based on an optical simulation using the topographical information; and
    forming one or more artificial grating areas on one or more sides of the defect based on the one or more grating repair specifications,
    wherein the one or more artificial grating areas are no wider than a predetermined wavelength used for photolithography in which the mask is used, and
    wherein the one or more artificial grating areas change the effective refractive index of a localized area encompassing the defect so that the defect does not cause an undesired image printing problem when the mask is exposed to a light source of the predetermined wavelength.

2. The method of claim 1 wherein the determined topographical information further includes phase depth information of the defect.

3. The method of claim 1 wherein the determined topographical information further includes a width of the defect.

4. The method of claim 1 wherein the determining one or more grating repair specifications further includes:
    determining a phase change to avoid the undesired image printing problem; and
    determining geometric specifications of the one or more artificial grating areas based on the determined phase change.

5. The method of claim 4 wherein the determining the phase change further includes generating aerial intensity and near field phase information for the defect.

6. The method of claim 4 wherein the determining geometric specifications of the one or more artificial grating areas further includes determining a groove depth, pitch and grating space of the one or more artificial grating areas.

7. The method of claim 6 wherein the determining a groove depth, pitch and grating space further includes:
    selecting the grating space;
    determining the groove depth;
    determining a fill factor based on the selected grating space; and
    determining the pitch based on the fill factor and the grating space.

8. The method of claim 4 wherein the determining the geometric specifications of the one or more artificial grating areas further includes determining a width of the one or more artificial grating areas.

9. The method of claim 1 further comprising confirming the defect being repaired by determining modified topographical information of the localized area and conducting one or more optical simulations using the modified topographical information.

10. The method of claim 1 wherein the mask is made of quartz.

11. A method for repairing defects in a mask to be used for a lithography process using a light source having a predetermined wavelength under 193 nm, the method comprising:

determining topographical information of a defect;

determining one or more grating repair specifications based on an optical simulation using the topographical information; and forming one or more artificial grating areas on one or more sides of the defect based on the one or more grating repair specifications, wherein the one or more artificial grating areas are no wider than the predetermined wavelength, and wherein the one or more artificial grating areas change the effective refractive index of a localized area encompassing the defect so that the defect does not cause an undesired image printing problem when the mask is exposed to the light source of the predetermined wavelength.

12. The method of claim 11 wherein the determined topographical information further includes phase depth information of the defect.

13. The method of claim 11 wherein the determined topographical information further includes a width of the defect.

14. The method of claim 11 wherein the determining the one or more grating repair specifications further includes:

determining a phase change to avoid the undesired image printing problem; and determining geometric specifications of the one or more artificial grating areas based on the determined phase change.

15. The method of claim 14 wherein the determining the phase change further includes generating aerial intensity and near field phase information for the defect.

16. The method of claim 14 wherein the determining geometric specifications of the one or more artificial grating areas further includes determining a groove depth, pitch and grating space of the one or more artificial grating areas.

17. The method of claim 16 wherein the determining the groove depth, pitch and grating space further includes:

selecting the grating space;

determining the groove depth;

determining a fill factor based on the selected grating space; and determining the pitch based on the fill factor and the grating space.

18. The method of claim 14 wherein the determining the geometric specifications of the one or more artificial grating areas further includes determining a width of the one or more artificial grating areas.

19. The method of claim 11 further comprising confirming the defect being repaired by determining the modified topographical information of the localized area and conducting one or more optical simulations using the modified topographical information.

20. A method for repairing mask pits on a quartz mask, the method comprising:

determining topographical information of a pit;

determining one or more grating repair specifications based on an optical simulation using the topographical information; and forming one or more artificial grating areas on one or more sides of the pit based on the one or more grating repair specifications, wherein the one or more artificial grating areas are no wider than a predetermined wavelength used for photolithography in which the mask is used, and wherein the one or more artificial grating areas change the effective refractive index of a localized area encompassing the pit so that the pit does not cause an undesired image printing problem when the mask is exposed to a light source of the predetermined wavelength.

21. The method of claim 20 wherein the determining the one or more grating repair specifications further includes:

determining a phase change to avoid the undesired image printing problem based on aerial intensity and near field phase information for the pit; and determining geometric specifications of the one or more artificial grating areas based on the determined phase change.

22. The method of claim 21 wherein the determining the geometric specifications of the one or more artificial grating areas further includes determining a groove depth, pitch and grating space of the one or more artificial grating areas.

23. The method of claim 20 further comprising confirming the pit being repaired by determining modified topographical information of the localized area and conducting one or more optical simulations using the modified topographical information.

* * * * *